United States Patent [19]

Eaton, Jr.

[11] 3,964,031

[45] June 15, 1976

[54] MEMORY CELL

[75] Inventor: Sargent Sheffield Eaton, Jr., Phillipsburg, N.J.

[73] Assignee: RCA Corporation, New York, N.Y.

[22] Filed: May 5, 1975

[21] Appl. No.: 574,686

[52] U.S. Cl. ........................... 340/173 R; 307/238; 307/279
[51] Int. Cl.² ........................................ G11C 11/40
[58] Field of Search ................ 340/173 FF, 173 R; 307/238, 279

[56] References Cited
UNITED STATES PATENTS
3,725,881  4/1973  Dellor ........................... 340/173 FF Primary Examiner—Terrell W. Fears
Attorney, Agent, or Firm—H. Christoffersen; S. Cohen

[57] ABSTRACT

A memory cell utilizing first and second cross-coupled CMOS inverters connected to a digit line. During a read command, one inverter is disconnected from the input node of the other inverter to prevent loss of the stored information.

8 Claims, 3 Drawing Figures

MEMORY CELL

The use of bistable multivibrators (flip-flops) as memory cell elements is well-known. A flip-flop may be realized using two cross-coupled inverter circuits and the inverter circuits may be of the type using complementary metal-oxide-semiconductor (CMOS) transistors. The flip-flop is coupled to a data or digit line by a transmission device which may be an MOS transistor. In addition, a second transmission device may be used to couple the cell to a second digit line.

When the same transmission device is used for both the read and write functions, it may be difficult to achieve nondestructive readout of the cell. If the impedance of the transmission device in its on condition is low enough to allow the cell to rapidly change its state and thereby its information content during the write operation, then the same device also may cause the cell to change its state at undesired times. For example, during the read mode, when it is desired to sense the information content of the cell in a nondestructive manner, a transient voltage or residual charge present on the digit line may, because of the relatively high capacitance of the line relative to the input capacitance of the cell, cause the cell to change its state, destroying the information contained therein.

The prior art discloses various techniques for minimizing the above problem. For example Katz, U.S. Pat. No. 3,521,242, maintains the impedance of the transmission device at a first relatively high level during the read mode. The cell is unable to change its state at this time. When information is to be written into the cell, the device impedance is lowered, thereby permitting the cell to change its state.

In the technique described by Gricchi et al. in U.S. Pat. No. 3,644,907, the cell power supply is reduced to a level at which the cell becomes "inoperative" when a write operation is to be performed. Information is then supplied to the cell and it momentarily is stored therein by parasitic capacitances associated with the MOS devices. The cell power is then restored and charge retained in the capacitor causes the cell to be set to the desired state.

In Smith et al., U.S. Pat. No. 3,813,653, the cell supply voltage is reduced to a value sufficiently high to enable the cell to remain in a static mode of operation prior to the application of write information. At this reduced level, the transmission device is able to supply (or sink) enough current to permit the cell to change its state. In both of the above references, cells whose state it had been difficult to change at full operating voltage, had this voltage reduced at the start of a write period then increased at the completion.

Additionally, precharging circuits may be utilized to prevent an unwanted change of state. The cell may be designed such that only a voltage representing a particular logic state can change the state of the cell. The digit lines are then precharged, before an address change, to a voltage representing the other logic state so that no cell along the addressed row can be disturbed.

Each of the above techniques has its advantages and disadvantages and factors such as the relative chip areas and complexity of the auxiliary circuitry needed must be considered by the integrated circuit designer. For example, when the precharging technique is used, the information content of the memory cell may not be sensed until the precharge signal has terminated. This may tend to slow down the operation of a memory array utilizing such a technique. In addition, where the memory array is fabricated in integrated circuit form on a single chip, and a precharge signal is required, a pin of the integrated circuit must be designated to receive the external precharge signal.

The circuits of the present invention permit nondestructive readout of a memory cell comprising first and second cross-coupled inverters. Switching means decouple the inverters during the interval that the cell is being addressed, thereby preventing an undesired change of state of the cell.

Figure 1:
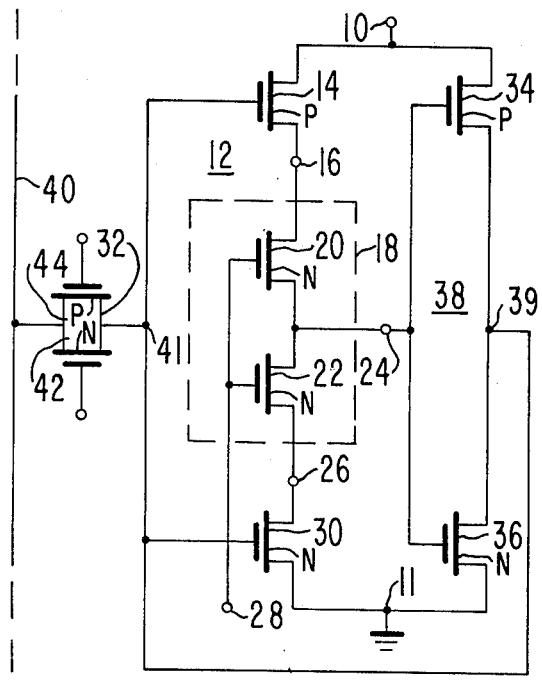
FIG. 1 is a schematic circuit diagram of a preferred embodiment of the invention.

In the circuit of FIG. 1, inverters 12 and 38 are coupled between a terminal 10 to which an operating potential +V may be applied and terminal 11 at a reference potential, herein ground. Inverter 12 comprises PMOS transistor 14 and NMOS transistor 30. The conduction paths of these transistors are connected in series between operating voltage terminals 10 and 11, switching circuit 18 serving to connect these paths to inverter output node 24. Inverter 38 comprises PMOS transistor 34 and NMOS transistor 36.

The conduction paths of transistors 34 and 36 are connected in series between terminals 10 and 11. The drain-source path of PMOS transistor 14 is coupled between terminal 10 and node 16 of switching circuit 18. The drain-source path of NMOS transistor 30 is coupled between the reference potential terminal 11 and node 26. Circuit 18 is thus connected in the signal path of inverter 12. The output node 24 of inverter 12 is connected to the input node (the common gate electrode connection) of inverter 38 while output node 39 of inverter 38 is connected to the input node 41 (the common gate electrode connection of transistors 14 and 30) of inverter 12. The inverters are coupled to digit line 40 by transmission device 32 which comprises a so-called dual transmission gate. The gate electrodes of dual gate 32 are connected to a source of address commands (not shown) which supplies complementary signals to the respective gate electrodes.

Node 28 of switching circuit 18 is connected to a source of switching or strobe commands (not shown). Switching circuit 18 includes two NMOS transistors 20 and 22 having their drain-source paths serially connected between nodes 16 and 26. The common connection of these paths connects to node 24 while the gate electrodes of these transistors are connected to node 28.

In the operation of the circuit of FIG. 1, the strobe circuit quiescently applies a level +V to terminal 28 to keep transistors 20 and 22 on. Assume that the cell is storing a binary zero, that is, transistors 36 and 14 are on the transistors 30 and 34 are off. This causes a voltage at or near the reference potential level (ground) to appear at the output node 39 of inverter 38 and +V to appear at node 24. Binary zero is arbitrarily assumed to be represented by a voltage at or near ground level and binary one by a voltage at or near the operating potential +V. It should be appreciated that when reference is made to a point at a particular binary value, that is simply a shorthand way of saying that a point is at a potential representing the particular binary value.

When it is desired to sense the state of the cell (a read operation), transmission device 32 is turned on (a one level, +V, is applied to the gate electrode of NMOS transistor 42 and a zero level is applied to the gate electrode of PMOS transistor 44), thereby coupling the input node 41 of the flip-flop digit line 40. The dual transmission gate 32 provides very fast response time when only a single digit line is to be coupled to the cell. While a single PMOS or NMOS transistor may be used as the transmission device, the single transistor would operate in the source follower mode for certain bias conditions. It is desirable to avoid this mode of operation because of its relatively slow switching speed compared to the non-source follower mode. With device 32, at least one transistor has the desired mode of operation for all bias conditions. As already mentioned, transmission device 32 is turned on by the memory address commands.

In a conventional four-transistor cell, a danger exists, whenever a row address (transistors 42 and 44) changes, that the stored information will be destroyed. If the cell is storing a zero and the capacitance associated with digit line 40 happens to be charged to a positive level when circuit 32 goes on, the digit line will discharge into the cell. Such discharge, in the conventional four-transistor cell, can switch transistor 30 on and 14 off driving node 24 to ground and this can turn transistor 34 on and 36 off.

The problem above is avoided in the circuit of the present invention by switching circuit 18. Concurrent with the address command, the strobe circuit changes the voltage applied to terminal 28 from +V to ground. This turns transistors 20 and 22 off, thus opening switch 18.

When switch 18 is opened, the input gates of inverter 38 are at a binary one level for the present example. The capacitance associated with each MOS gate will maintain this level for a period of time which in turn maintains the output of 38 at the binary zero level. The presence of a positive residual voltage on digit line 40 will not be able to change the state of the cell when the line is coupled to the cell via transmission device 32. This is because the opening of switch 18 breaks the cross-coupling between the inverters, thereby preventing the regenerative action necessary for the cell to change state. Within a short time, the digit line is discharged through the conducting transistor 36 of inverter 38. Once this discharge has occurred, the strobe pulse may be terminated. The zero stored in the cell will remain stored, as node 24 will still be at +V and node 41 will now again be at ground.

With the circuit of the present invention, the state of the cell may be sensed while the strobe pulse is present. This is a decided advantage over techniques that precharge the digit lines. With the latter technique, the read operation generally cannot begin until the precharge pulse has terminated. Thus, the present invention permits the read operation to be completed in less time than is required where line precharing is used. In addition, the width of the strobe pulse is not critical. It only has a requirement with respect to its minimum width. This width must be adequate to permit the digit line to discharge or to be charged to the desired level. Any pulse width in excess of this value will not affect the read operation. The strobe pulse may therefore extend over the entire read interval. When it is desired to write into the cell, the strobe pulse must be inhibited, that is, +V must be present at terminal 28. The signal used to inhibit the strobe may be derived from the memory write command.

While the above example described the operation of the circuit of the present invention when a binary zero is being stored, it should be appreciated that the similar benefits are provided when a binary one is being stored. For the latter condition, transistors 34 and 30 are on while 14 and 36 are off. With a conventional four-transistor cell, an undesired change of state may occur if the digit line is at the binary zero level. When the cell is coupled to the digit line the cell input node voltage, if at the binary one level, may drop during the brief interval when the digit line capacitance is being charged. This momentary voltage drop may cause the state of the cell to change. Switching circuit 18 prevents an undesired change of state of the cell in a manner similar to that described in the earlier given example where the cell was storing a binary zero.

The strobe pulse must be applied to terminal 28 concurrent with the application of the address command. If the pulse is applied after the address command has been applied to the transmission device, the cell could go through an undesired change of state.

The strobe pulse may be generated from the address command signals by detecting when a change of address occurs. This detection may be done, for example, by capacitive means or by digital comparison techniques. This signal may then trigger a device such as a monostable multivibrator whose output is the strobe pulse. Alternatively, the pulse generating device may be triggered by the read command. To compensate for circuit delays which may cause the strobe pulse to be applied to the cell after the address command, the application of the address command may be inhibited until the strobe pulse is generated. If the circuit of FIG. 1 is to be used as part of an integrated circuit memory array, it is advantageous to include the strobe pulse generator and its trigger source on the same chip as the array. The reason is that an extra pin to an off-chip circuit will not be needed.

Figure 2:
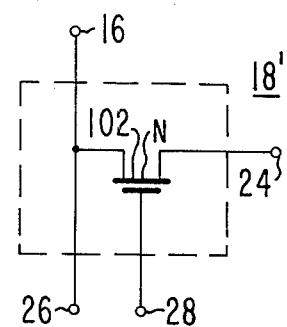
FIG. 2 is a schematic circuit diagram of a modified form of a portion of the circuit of FIG. 1.

The circuit of FIG. 2 is an alternative embodiment of the switching circuit 18 of FIG. 1. Corresponding nodes have been given the same reference designation in both figures. Circuit 18' of FIG. 2 may be connected into the circuit of FIG. 1 in place of 18. In the circuit of FIG. 2, the drain-source path of NMOS transistor 102 is connected between node 34 and commonly connected nodes 16 and 26. Node 28 is connected to the gate electrode of 102.

In the operation of the circuit of FIG. 2, a strobe pulse supplied to node 28 decouples the signal path of inverter 12 from the input of inverter 38. While the two transistor switching element 18 of FIG. 1 is more complex than its single transistor counterpart 18', the former does offer an advantage that in certain integrated circuit processes the layout of element 18 is more compact than that for element 18'.

While the switching circuits 18 and 18' have been realized with NMOS transistors, it should be appreciated that PMOS transistors may be used instead. In addition, circuit 18 could be realized with complementary MOS device if a source of complementary strobe pulses is available.

Figure 3:
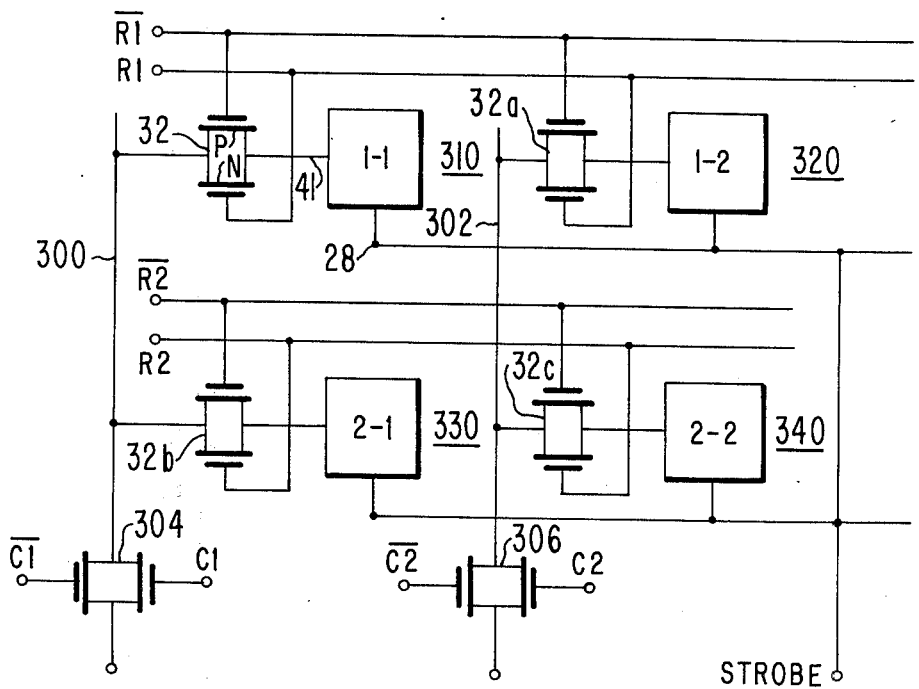
FIG. 3 is a schematic circuit diagram of a portion of a memory array that utilizes the circuit of the present invention.

In the circuit of FIG. 3, a portion of a semiconductor memory array utilizing the present invention is shown.

Memory cell element 1-1 is coupled to digit line 300 by dual transmission gate 32. Elements 1-1 and 32 together comprise memory cell 310. This cell is equivalent to the circuit of FIG. 1. The circuit of FIG. 1 is also represented by cells 320, 330 and 340. Gate 32 is coupled through row address lines $R_1$ and $\overline{R}_1$ to a source of address commands (not shown) while node 28 is connected to a source of strobe commands (not shown). In a similar manner cells 320, 330 and 340 are coupled to appropriate digit and control lines. Digit lines 300 and 302 are coupled to a system digit line (not shown) by dual transmission gates 304 and 306, respectively. The control electrodes of each of these gates are connected to a source of complementary column address signals (not shown).

In the operation of the circuit of FIG. 3, concurrent with any row address change to the array, a strobe pulse is applied to the entire memory. The strobe pulse prevents the addressed cell from changing its state while being read, in the manner described for the circuit of FIG. 1. As indicated for the circuit of FIG. 1, the strobe pulse may be just long enough to allow the digit line capacitance to charge or discharge or it may extend as long as the duration of the read interval. While FIG. 3 shows a 2×2 cell array, it should be appreciated that the invention may be used in conjunction with any MxN element array. It should be further appreciated that the dual transmission gates of FIG. 3 could each be replaced by a PMOS or NMOS transistor.

What is claimed is:

1. A memory cell comprising, in combination:
   first and second inverters, each having an input node and an output node, each coupled at its output node to the input node of the other;
   a digit line;
   means responsive to a read command for coupling said digit line to the input node of the first of said inverters; and
   means responsive to a strobe signal concurrent with said read command for disconnecting the input node of the second of said inverters from the first of said inverters.

2. The combination set forth in claim 1 wherein each inverter comprises two transistors, the first of said two transistors a PMOS device and the second of said two transistors an NMOS device, the conduction paths of said two transistors connected in series between two operating voltage terminals, the gate electrodes of said two transistors connected, in common, to an input node, and the point at which the two conduction paths are coupled connected to an output node.

3. The combination set forth in claim 2 wherein said means responsive to a strobe signal comprises two normally closed switch elements, one between the PMOS transistor conduction path of said first inverter and the first inverter output node and the other between the conduction path of the NMOS transistor conduction path of said first inverter and the first inverter output node.

4. The combination set forth in claim 3 wherein said switch elements comprise first and second MOS transistors, each transistor being of the same conductivity type.

5. The combination of claim 2 wherein said means responsive to a strobe comprises a normally closed switch element coupled between a common connection of said first inverter PMOS and NMOS conduction paths and said first inverter output node.

6. The combination of claim 5 wherein said switch element comprises an MOS transistor.

7. In a memory array having M rows and N columns intersecting said rows, where M and N are integers, said array comprising, in combination:
   N column digit lines;
   M sets of row address lines;
   M times N memory cells, each cell coupled between a digit line and the corresponding intersecting row address set, said cell comprising, in combination:
   first and second inverters, each having an input node and an output node, each coupled at its output node to the input node of the other;
   means connected to a said row address set for coupling said digit line to the input node of the first of said inverters; and
   means responsive to a strobe signal concurrent with said read command for disconnecting the input node of the second of said inverters from the first of said inverters.

8. The combination set forth in claim 7 wherein each inverter comprises two transistors, the first of said two transistors a PMOS device and the second of said two transistors an NMOS device, the conduction paths of said two transistors connected in series between two operating voltage terminals, the gate electrodes of said two transistors connected, in common, to an input node, and the point at which the two conduction paths are coupled connected to an output node.

* * * * *